United States Patent
Yamada

(10) Patent No.: US 7,855,568 B2
(45) Date of Patent: Dec. 21, 2010

(54) PROBE APPARATUS WITH MECHANISM FOR ACHIEVING A PREDETERMINED CONTACT LOAD

(75) Inventor: Hiroshi Yamada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 44 days.

(21) Appl. No.: 12/484,518

(22) Filed: Jun. 15, 2009

(65) Prior Publication Data

US 2009/0315580 A1    Dec. 24, 2009

(30) Foreign Application Priority Data

Jun. 20, 2008    (JP) ............... 2008-162379

(51) Int. Cl.
*G01R 31/20*    (2006.01)
(52) U.S. Cl. .............. 324/758; 324/754; 324/158.1
(58) Field of Classification Search .......... 324/754, 324/758, 158.1
See application file for complete search history.

(56) References Cited

U.S. PATENT DOCUMENTS

| | | | |
|---|---|---|---|
| 6,111,419 A * | 8/2000 | Lefever et al. ............. | 324/754 |
| 6,794,889 B2 * | 9/2004 | Jafari et al. ............... | 324/758 |
| 6,825,680 B1 * | 11/2004 | Kogan et al. .............. | 324/758 |
| 6,870,382 B2 * | 3/2005 | Harris ...................... | 324/758 |
| 7,352,198 B2 * | 4/2008 | Nayak et al. .............. | 324/758 |
| 2003/0173951 A1 | 9/2003 | Suzuki | |
| 2005/0253613 A1 | 11/2005 | Komatsu et al. | |

FOREIGN PATENT DOCUMENTS

| | | |
|---|---|---|
| JP | 2003-50271 | 2/2003 |
| JP | 2004-265895 | 9/2004 |
| JP | 2005-49254 | 2/2005 |

* cited by examiner

*Primary Examiner*—Ha Tran T Nguyen
*Assistant Examiner*—Richard Isla Rodas
(74) *Attorney, Agent, or Firm*—Oblon, Spivak, McClelland, Maier & Neustadt, L.L.P.

(57) ABSTRACT

A probe apparatus includes a mounting table having a mounting table main body and a chuck top, cylinder mechanisms surrounding a mount of the chuck top, and a connecting mechanism to releasably connect the cylinder mechanisms to a head plate horizontally supporting a probe card. When a semiconductor wafer, mounted on the mount, comes into contact with probes of the probe card, a control unit operates the cylinder mechanisms and the connecting mechanism to connect the cylinder mechanisms to the head plate. Thereafter, the control unit further operates the cylinder mechanisms, to move the chuck top upward from the mounting table main body by a predetermined overdrive amount. Accordingly, the probe apparatus achieves an originally required contact load between the semiconductor wafer and the probes of the probe card while preventing the probe card from being displaced upward during overdriving of the semiconductor wafer, thereby enabling a highly reliable test.

6 Claims, 7 Drawing Sheets

PROBE APPARATUS WITH MECHANISM FOR ACHIEVING A PREDETERMINED CONTACT LOAD

FIELD OF THE INVENTION

The present invention relates to a probe apparatus wherein a plurality of probes of a probe card reliably comes into electrical contact with an object to be tested, such as, e.g., a semiconductor wafer, with a predetermined load, thereby enabling electric characteristic test of the object.

BACKGROUND OF THE INVENTION

A conventional probe apparatus includes a main body, a mounting table arranged to be movable in directions of X, Y, Z and ⊖ within the main body, on which an object to be tested (for example, a semiconductor wafer) is mounted, a probe card having a plurality of probes to be brought into contact with a plurality of electrode pads of the semiconductor wafer mounted on the mounting table, a head-plate to horizontally support the probe card, and an alignment device to implement position alignment of the probes and the semiconductor wafer on the mounting table. In the conventional probe apparatus, after the electrode pads of the semiconductor wafer and the probes are aligned with each other, signals are transmitted between the probes of the probe card, which is electrically connected to a tester via a test-head and a connection ring, and the electrode pads of respective devices provided in the semiconductor wafer, thereby implementing electric characteristic test of the respective devices.

The semiconductor wafer, for example, as shown in FIGS. 6A to 6C, may come into electrical contact with the probes of the probe card, to implement electric characteristic test. More specifically, as shown in FIG. 6A, once the semiconductor wafer W, mounted on the mounting table 1, reaches a position immediately under the probe card 2, the mounting table 1 is moved upward to allow the electrode pads (not shown) of the semiconductor wafer W to come into contact with the corresponding probes 2A as shown in FIG. 6B. Then, as the mounting table 1 is overdriven from the position shown in FIG. 6B to a position shown in FIG. 6C where the semiconductor wafer W comes into contact with the probes 2A with a predetermined load, the electrode pads of the semiconductor wafer W comes into electrical contact with the probes 2A. In this case, the tester implements transmission and reception of signals with the electrode pads of the semiconductor wafer W via the probes 2A, thereby sequentially implementing electric characteristic test of the devices. The probe card 2, as shown in FIGS. 6A to 6C, is adapted to come into contact with all the electrode pads of the semiconductor wafer W at once. In such a contact state of the probe card 2, for example, electric characteristic test is implemented on all the devices plural times on a "per a predetermined number of devices" basis. In FIGS. 6A to 6C, reference numeral "3" indicates the head-plate used to horizontally support the probe card 2.

However, in the above-described conventional probe apparatus, when the mounting table 1 is overdriven by a preset distance while the semiconductor wafer W is in contact with the probes 2A, considerable contact load may be exerted between the semiconductor wafer W and the probes 2A. The contact load, for example, as shown in FIG. 6C, causes a central portion of the head-plate 3 to be slightly upwardly deformed, resulting in upward displacement of the probe card 2. Accordingly, even if the mounting table 1 is overdriven by the preset distance, the head-plate 3 is deformed from a position as shown in the left half of FIG. 7 to a position as shown in the right half of FIG. 7, thus causing the probe card 2 to be displaced upward by, e.g., about 10% to 20% of the overdrive amount of the mounting table 1. For that reason, an originally required overdrive amount (e.g., about 100 μm) may not be accurately applied to the mounting table 1, and also a good electrical contact state may not be guaranteed, which may deteriorate the reliability of the test. Especially, when test is performed in a state where the probes 2A of the probe card 2 are required to be brought into contact with respectively corresponding devices of the semiconductor wafer W at once, the deformation of the head-plate 3 may affect the test greatly.

As for a technique related to an overdriving, there are suggested techniques disclosed in Patent Documents 1 to 3. In the technique of Patent Document 1, there is provided an optical length-measuring machine for measuring a vertical displacement of a probe card. A lifting amount of a mounting table is regulated based on the displacement of the probe card measured by the optical length-measuring machine, and the semiconductor wafer and the probe card are brought into contact with each other by a proper overdrive amount. In the technique of Patent Document 2, an overdrive amount of a mounting table can be appropriately set by accurately detecting a displacement of a probe card deformed due to the overdrive of the mounting table. Both these techniques obtain an appropriate overdrive amount of a mounting table by eliminating the effect caused by deformation of the probe card or sagging of the mounting table, but may not cope with deformation of interface parts including the probe card and the head-plate during test. In addition, in the technique of Patent Document 3, a stopper is provided at a side of a chuck top, to manage a predetermined overdrive amount, thereby preventing a probe card or a head-plate from being deformed by heat transmitted from the chuck top and eliminating any negative effect on the overdrive amount.

[Patent Document 1] Japanese Patent Laid-open Publication No. 2004-265895

[Patent Document 2] Japanese Patent Laid-open Publication No. 2003-050271

[Patent Document 3] Japanese Patent Laid-open Publication No. 2005-049254

SUMMARY OF THE INVENTION

In view of the above, the present invention provides a probe apparatus, which can acquire an originally required contact load between a plurality of electrodes of an object to be tested and a plurality of probes of a probe card while preventing or restricting the probe card from being displaced during overdriving of the object, thereby enabling highly reliable test.

In accordance with an aspect of the present invention, a probe apparatus includes a movable mounting table on which an object to be tested is mounted, a probe card arranged above the mounting table and having a plurality of probes to be brought into contact with electrodes of the object, a supporting member to horizontally support the probe card, and a control unit for controlling various components including the mounting table, the probe apparatus being adapted to implement electric characteristic test of the object by overdriving the mounting table by a predetermined distance to allow the object to be brought into contact with the probes with a predetermined load. Here, the mounting table includes a mounting table main body and a chuck top provided on the mounting table main body, the chuck top being separable from the mounting table main body. The chuck top is provided with a mount on which the object is mounted and a plurality of cylinder mechanisms surrounding the mount, and the supporting member is provided with a connecting mechanism to releasably connect the supporting member and the cylinder mechanisms to each other. In addition, the control unit operates the cylinder mechanisms and the connecting mechanism to connect the supporting member and the cylinder mechanisms to each other when the object comes into contact with the probes and thereafter, further operates the cylinder mechanisms to move the chuck top upward from the mounting table main body by the predetermined distance so as to achieve electrical contact between the electrodes of the object and the probes with the predetermined load.

The mounting table main body and the chuck top, respectively, may include an anti-misalignment structure to prevent the mounting table main body and the chuck top from being misaligned with each other.

In accordance with another aspect of the present invention, a probe apparatus includes a movable mounting table having a mount on which an object to be tested is mounted, a probe card arranged above the mounting table and having a plurality of probes to be brought into contact with electrodes of the object, a supporting member to horizontally support the probe card, and a control unit for controlling various components including the mounting table, the probe apparatus being adapted to implement electric characteristic test of the object by overdriving the mounting table by a predetermined distance to allow the object to be brought into contact with the probes with a predetermined load. Here, a plurality of cylinder mechanisms surrounding the mount is provided on an upper surface of the mounting table, and the supporting member is provided with a connecting mechanism to releasably connect the supporting member and the cylinder mechanisms to each other. In addition, the control unit operates the cylinder mechanisms and the connecting mechanism to connect the supporting member and the cylinder mechanisms to each other when the object comes into contact with the probes and thereafter, further operates the cylinder mechanisms to pull the supporting member toward the mounting table so as to achieve electrical contact between the electrodes of the object and the probes with the predetermined load.

The connecting mechanism may include chucks to clamp the respective cylinder mechanisms.

In accordance with the probe apparatus of the present invention, as a result of reliably acquiring the predetermined overdrive amount of the object to be tested while preventing or restricting upward displacement of the probe card, the object can come into electrical contact with the probes of the probe card with an originally required contact load, thereby enabling highly reliable test.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Hereinafter, embodiments of the present invention will be described with reference to FIGS. 1 to 5 which form a part hereof.

First Embodiment

Figure 1:
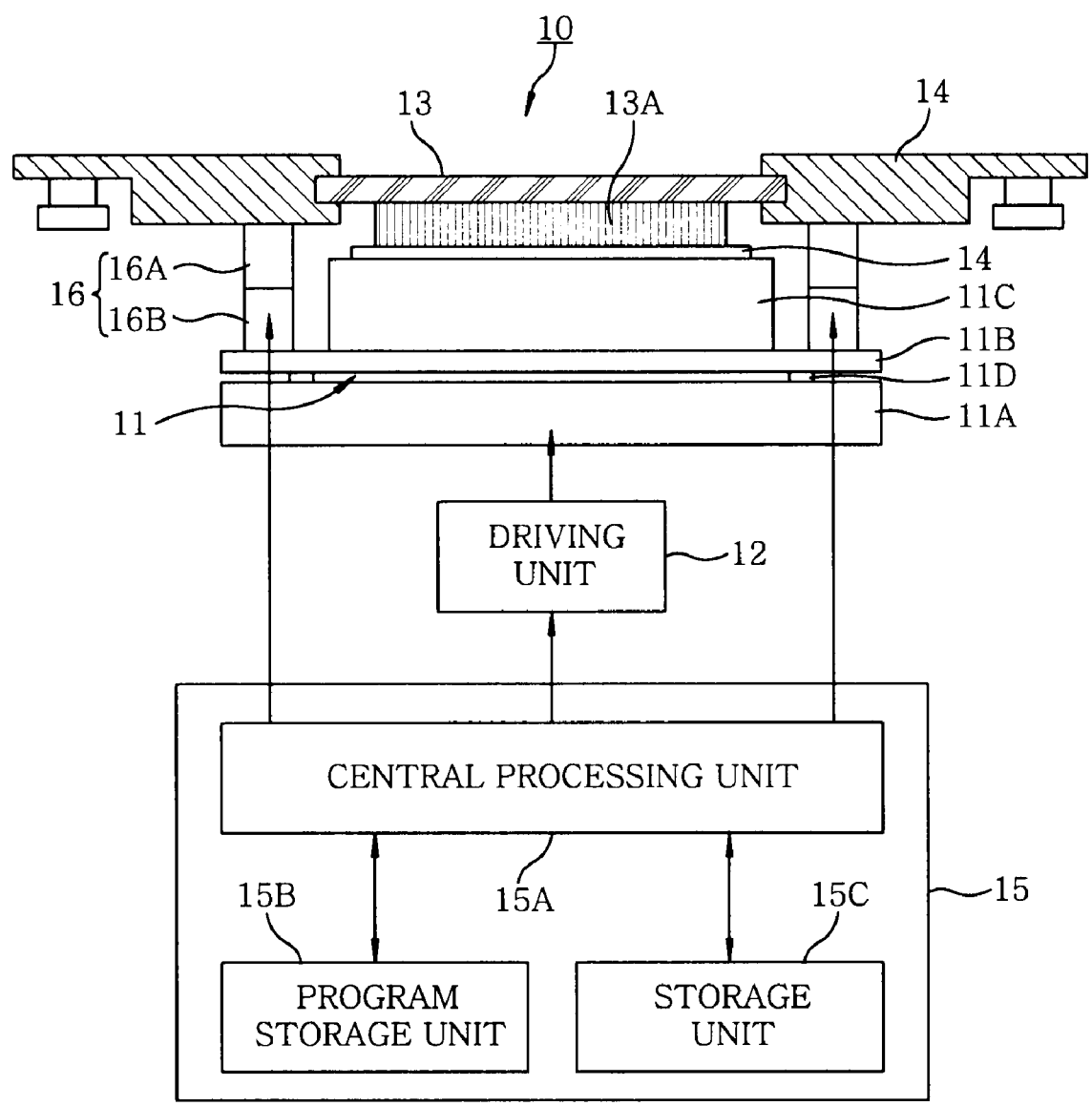
FIG. 1 is a schematic view showing the configuration of a probe apparatus in accordance with a first embodiment of the present invention.

First, a probe apparatus 10 in accordance with the first embodiment will be described with reference to FIG. 1. The probe apparatus 10 of the first embodiment, for example, as shown in FIG. 1, includes: a mounting table 11 on which an object to be tested (for example, a semiconductor wafer W) is mounted, the mounting table 11 being movable in directions of X, Y, Z and $\ominus$; a drive mechanism 12 to move the mounting table 11 in directions of X, Y, Z and $\ominus$; a probe card 13 arranged above the mounting table 11 and having a plurality of probes 13A to come into contact with a plurality of electrode pads of the semiconductor wafer W; a supporting member (for example, a head-plate) 14 to horizontally support the probe card 13; and a control unit 15 to control various components including the mounting table 11. In this probe apparatus, under the control of the control unit 15, the mounting table 11 is overdriven by a predetermined distance to allow the electrode pads of the semiconductor wafer W to be brought into contact with the probes 13A of the probe card 13 with a predetermined load, thereby enabling electric characteristic test of the semiconductor W. Besides, although it is not illustrated, as in the conventional probe apparatus, an alignment mechanism is provided at the probe apparatus 10.

The mounting table 11, as shown in FIG. 1, includes a mounting table main body 11A and a chuck top 11B separatable from the mounting table main body 11A. As will be described later, the chuck top 11B is moved upward from the mounting table main body 11A to overdrive the semiconductor wafer W. The chuck top 11B includes a mount 11C, on which the semiconductor wafer W is placed by vacuum adsorption.

Figure 2A:
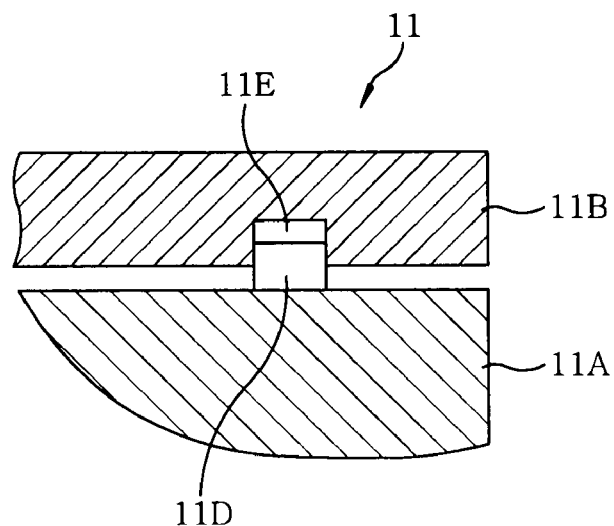
FIGS. 2A and 2B are views illustrating main parts of the probe apparatus shown in FIG. 1, FIG. 2A being a sectional view illustrating a connecting region between a chuck top and a body of a mounting table, and FIG. 2B being a partial sectional view illustrating a connecting mechanism used to connect the chuck top and a head-plate to each other.

As shown in FIGS. 1 and 2A, a plurality of protrusions 11D are formed in a predetermined pattern on an upper surface of the mounting table main body 11A. To correspond to the protrusions 11D, a plurality of recesses 11E is formed in a predetermined pattern on a lower surface of the chuck top 11B. Even when the chuck top 11B is moved upward from the mounting table main body 11A, the protrusions 11D partially remain in the recesses 11E of the chuck top 11B. Accordingly, when the chuck top 11B is moved downward to be seated on the mounting table main body 11A, the chuck top 11B can be returned to its original position under the guidance of the protrusions 11D.

As shown in FIG. 1, a plurality of cylinder mechanisms 16 is arranged at predetermined intervals on an outer peripheral region of an upper surface of the chuck top 11B. The cylinder mechanisms 16 surround the mount 11C for the semiconductor wafer W. Each of the cylinder mechanisms 16 includes a rod 16A and a cylinder 16B, the rod 16A being configured to be extracted from or retracted into the cylinder 16B. The cylinder mechanisms 16, as will be described later, cooperate with the mounting table 11 and a connecting mechanism 17 (see FIG. 2B) under the control of the control unit 15 to move the chuck top 11B upward from the mounting table main body 11A so that the semiconductor wafer W is overdriven.

More specifically, a plurality of recess portions 14A, into which the respective rods 16A of the cylinder mechanisms 16 are fitted, is formed in a lower surface of the head-plate 14. At a time when the semiconductor wafer W comes into contact with the probes 13A by the upward movement of the mounting table 11 under the control of the control unit 15 without being overdriven, the cylinder mechanisms 16 are operated together such that the rods 16A are fitted into the respective recess portions 14A. In addition, once the rods 16A of the cylinder mechanisms 16 are fitted into the recess portions 14A, the connecting mechanism 17 is driven to clamp the rods 16A, thus connecting the head-plate 14 and the cylinder mechanisms 16 to each other.

Figure 2B:
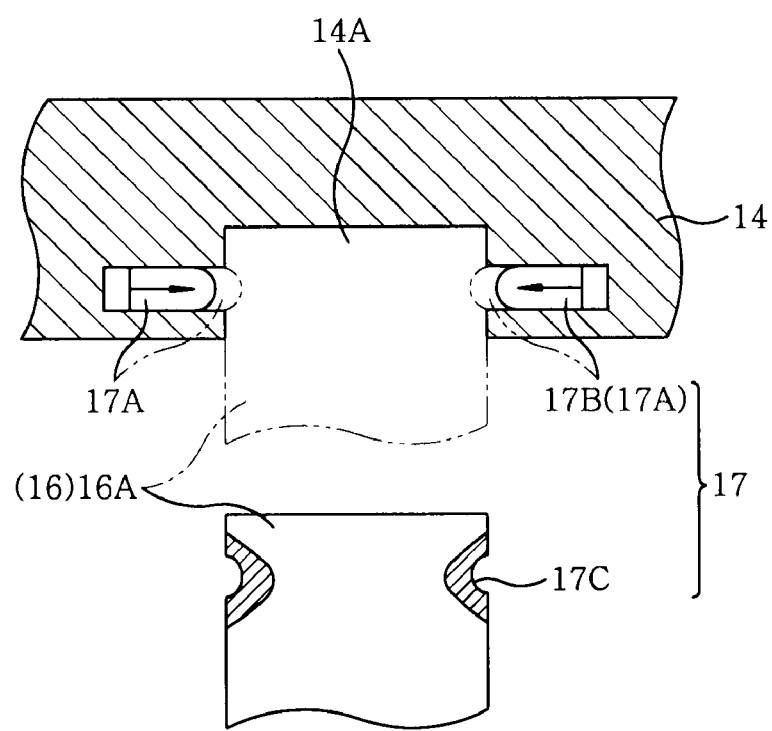

The connecting mechanism 17, as shown in FIG. 2B, includes chucks 17A, as a main part thereof, provided in the head-plate 14. The chucks 17A are configured to clamp upper end portions of the rods 16A of the cylinder mechanisms 16. Each of the chucks 17A includes a plurality of, e.g., three, claws 17B radially arranged at predetermined intervals circumferentially around each of the recess portions 14A. The claws 17B are radially horizontally moved toward or away from a peripheral wall surface of the recess portion 14A. Meanwhile, recesses 17C are formed, corresponding to the claws 17B, in an upper end portion of the rod 16A of each of the cylinder mechanisms 16. Once the rod 16A is fitted into the recess portion 14A, as represented by the arrows of FIG. 2B, the claws 17B are moved together beyond the peripheral wall surface of the recess portion 17C to be fitted into the recesses 17C of the rod 16A, thereby clamping the rod 16A. Thus, it is possible to connect the cylinder mechanism 16 and the head-plate 14 to each other. Alternatively, if the chuck 17A is configured to fixedly clamp the rod 16A, the recesses 17C may be omitted.

The cylinder mechanisms 16, connected to the head-plate 14 as described above, pull and move the chuck top 11B upward from the mounting table main body 11A by retracting the rods 16A by an appropriate distance corresponding to a preset overdrive amount. Accordingly, as a result of retracting the rods 16A of the cylinder mechanisms 16, the semiconductor wafer W on the chuck top 11B is brought into contact with the probes 13A with a predetermined load, thereby enabling electrical contact therebetween.

The control unit 15, as shown in FIG. 1, includes a central processing unit 15A, a program storage unit 15B in which various programs are stored, and a storage unit 15C in which various data are stored. The control unit 15 is designed to control various components such as the mounting table 11 and the like. The program storage unit 15B stores programs to control, e.g., the cylinder mechanisms 16 and the connecting mechanism 17. The central processing unit 15A reads and executes the programs. The storage unit 15C stores data such as an originally required preset overdrive amount and the like. The cylinder mechanisms 16 are driven based on the preset overdrive amount, to move the chuck top 11B upward from the mounting table main body 11A by a distance corresponding to the preset overdrive amount.

Upon a test operation, the mounting table 11 is moved upward by a predetermined distance under the control of the control unit 15 and the rods 16A of the cylinder mechanisms 16 are extracted by a predetermined distance. Moreover, the electrode pads of the semiconductor wafer W are brought into contact with the probes 13A of the probe card 13 at once and the rods 16A are fitted into the respective recess portions 14A of the head-plate 14. In this case, the connecting mechanism 17 is driven to clamp the rods 16A by using the chucks 17A, thereby connecting the head-plate 14 and the cylinder mechanisms 16 to each other. At this time, the mounting table 11 is not overdriven and substantially no load is exerted between the electrode pads of the semiconductor wafer W and the probes 13A. Subsequently, as the rods 16A of the cylinder mechanisms 16 are retracted to move the chuck top 11B upward from the mounting table main body 11A by a preset overdrive amount under the control of the control unit 15, the electrode pads of the semiconductor wafer W and the probes 13A are brought into electrical contact with each other with an originally required predetermined load.

Next, an operation of the probe apparatus 10 according to the first embodiment will be described with reference to FIG. 3. If the probe apparatus 10 is operated under the control of the control unit 15 and the semiconductor wafer W is mounted on the mount 11C of the chuck top 11B of the mounting table 11, the semiconductor wafer W is fixedly placed on the mount 11C of the chuck top 11B by adsorption. Then, the electrode pads of the semiconductor wafer W on the mounting table 11 are aligned with the probes 13A of the probe card 13 by the operation of an alignment device (not shown).

Figure 3A:
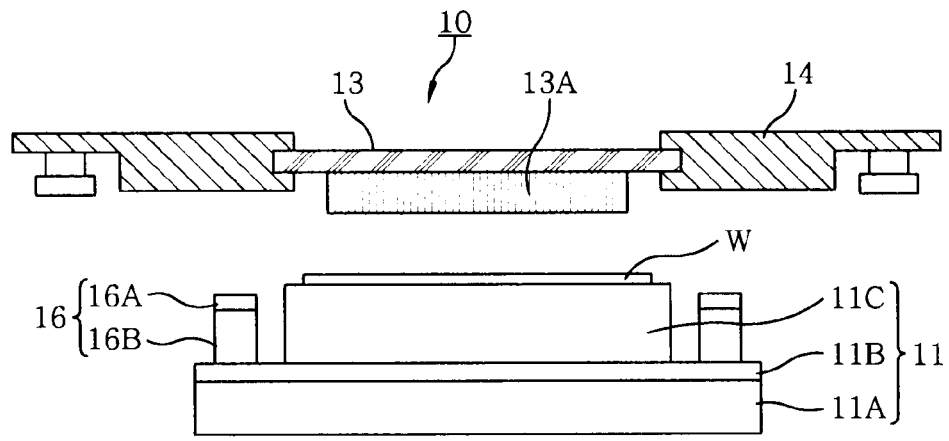
FIGS. 3A to 3C are process views, respectively, illustrating the sequence of a process in which a semiconductor wafer is brought into electrical contact with a probe card.

After the alignment operation, as shown in FIG. 3A, the mounting table 11 is moved in directions of X and Y. The movement of the mounting table 11 is stopped when the semiconductor wafer W reaches immediately below the center of the probe card 13. Subsequently, the mounting table 11 is moved upward by a preset distance stored in the storage unit 15C, causing the semiconductor wafer W to come into contact with the probe cards 13A of the probe card 13. At this time, the semiconductor wafer W and merely comes into contact with the probes 13A without being overdriven, and no load is exerted therebetween.

Figure 3B:
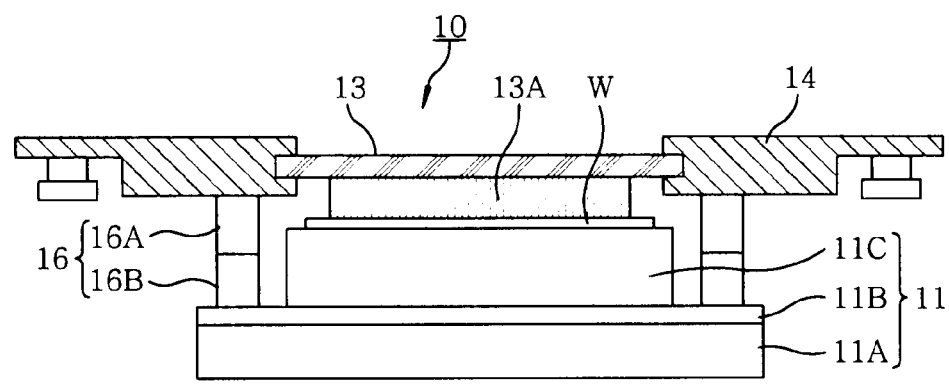

When the semiconductor wafer W comes into contact with the probes 13A as shown in FIG. 3B, the rods 16A of the cylinder mechanisms 16 are extracted as shown in FIG. 2B fitted into the respective recess portions 14A of the head-plate 14 as represented by the dash dotted line of FIG. 2B. Once the rods 16A are fitted into the recess portions 14A, the chucks 17A of the connecting mechanism 17 are operated. In this case, as shown in FIG. 2B, as the three claws 17B of each of the chucks 17A are fitted into the recesses 17C of each of the rods 16A, the chucks 17A clamp the rods 16A, thus connecting the head-plate 14 and the cylinder mechanisms 16 to each other.

Figure 3C:
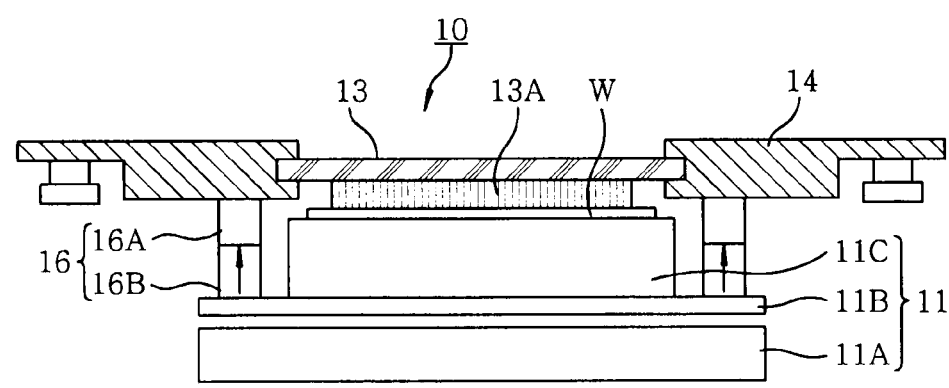
Figure 4:
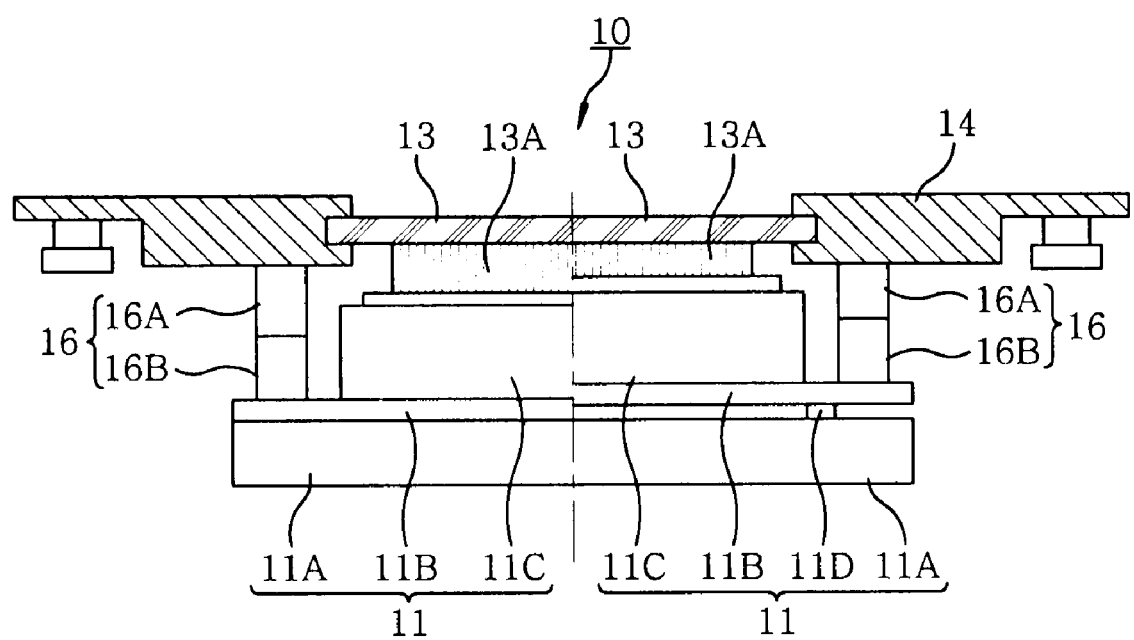
FIG. 4 is a side view illustrating states before and after when the semiconductor wafer is overdriven while coming into contact with the probe card.

Thereafter, if the rods 16A of the cylinder mechanisms 16 are retracted based on a preset overdrive amount stored in the storage unit 15C, the chuck top 11B is pulled toward the head-plate 14 by a distance corresponding to the preset overdrive amount. This prevents the head-plate 14 from being deformed and the probe card 13 from being displaced. Therefore, as shown in FIG. 3C, the chuck top 11B is moved upward from the mounting table main body 11A toward the head-plate 14 by a distance corresponding to the preset overdrive amount and a predetermined load is exerted between the electrode pads of the semiconductor wafer W and the probes 13A, whereby the semiconductor wafer W on the chuck top 11B may come into electrical contact with the probes 13A. The left half of FIG. 4 illustrates a state in which the mounting table 11 is moved upward to cause the semiconductor wafer W to be brought into contact with the probes 13A without being overdriven, while the right half of FIG. 4 illustrates a state in which the chuck top 11B is pulled toward the head-plate 14 to be moved upward from the mounting table main body 11A by the preset overdrive amount by the operation of the cylinder mechanisms 16. Accordingly, the chuck top 11B is reliably moved upward by the preset overdrive amount by the cylinder mechanisms 16, and a predetermined load is exerted between the semiconductor wafer W and the probes 13A to achieve electrical connection therebetween.

With relation to the upward movement of the chuck top 11B, the chuck top 11B is moved upward under the guidance of the protrusions 11D provided at the mounting table main body 11A. Since the upper end portions of the protrusions 11D remain in the recesses 11E of the chuck top 11B even after the chuck top 11B has been moved upward, there is no risk that the chuck top 11B is misaligned with the mounting table main body 11A. In such an aligned state, a tester receives or transmits signals to or from respective devices of the semiconductor wafer W via the probe card 13, thereby implementing electric characteristic test for the semiconductor wafer W, i.e., all the devices of the semiconductor wafer W in sequence.

If the rods 16A of the cylinder mechanisms 16 are extracted by a distance corresponding to the preset overdrive amount after the test, the chuck top 11B is moved downward under the guidance of the protrusions 11D to thereby be seated on the mounting table main body 11A. Thereafter, the claws 17B of the connecting mechanism 17, i.e., the three claws 17B per each rod 16A are moved backward beyond the peripheral wall surface of the corresponding one of the recess portions 14A to release the rod 16A, thereby disconnecting the cylinder mechanisms 16 from the head-plate 14. After the mounting table 11 is moved downward and returned to its original reference position, the semiconductor wafer W, which has been tested, is replaced by a next semiconductor wafer W, and the next semiconductor wafer W is tested in the above-described sequence.

As described above, according to the first embodiment, the mounting table 11 includes the mounting table main body 11A and the chuck top 11B disposed on the mounting table main body 11A, the chuck top 11B being separable from the mounting table main body 11A, and the cylinder mechanisms 16 surround the mount 11C of the chuck top 11B on which the semiconductor wafer W is mounted. Moreover, the connecting mechanism 17 to releasably connect the head-plate 14 and the cylinder mechanisms 16 to each other is provided in the head-plate 14. When the semiconductor wafer W comes into contact with the probes 13A, the control unit 15 operates the cylinder mechanisms 16 and the connecting mechanism 17 to connect the head-plate 14 and the cylinder mechanisms 16 to each other. Thereafter, the control unit 15 further operates the cylinder mechanisms 16 to move the chuck top 11B upward from the mounting table main body 11A by a distance corresponding to the preset overdrive amount, so as to achieve electrical contact between the semiconductor wafer W and the probes 13A with an originally required predetermined load. This prevents or restricts upward displacement of the probe card 13 and reliably assures the preset overdrive amount of the semiconductor wafer W. As a result, the electrode pads of the semiconductor wafer W and the probes 13A of the probe card 13 come into electrical contact with each other with an originally required load, enabling highly reliable test.

Further, according to the first embodiment, the protrusions 11D are formed at the upper surface of the mounting table main body 11A, and the recesses 11E are formed, corresponding to the protrusions 11D, on the lower surface of the chuck top 11B. The protrusions 11D and recesses 11E function to prevent misalignment between the mounting table main body 11A and the chuck top 11B and therefore, the chuck top 11B can be moved upward or downward from or to the mounting table main body 11A without a risk of misalignment. The connecting mechanism 17 includes the chucks 17A configured to clamp the rods 16A of the respective cylinder mechanisms 16. As the chucks 17A clamp the respective rods 16, reliable connection between the head-plate 14 and the cylinder mechanisms 16 can be accomplished. Then, the chuck top 11B can be moved upward from the mounting table main body 11A by the cylinder mechanisms 16 by the distance corresponding to the preset overdrive amount.

Second Embodiment

Figure 5A:
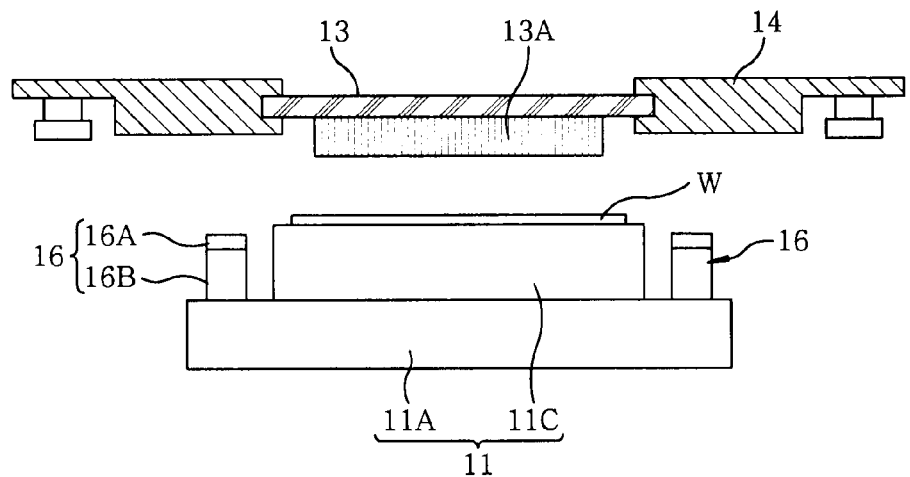
FIGS. 5A to 5C are process views, respectively, corresponding to FIGS. 3A to 3C, illustrating a probe apparatus in accordance with a second embodiment of the present invention.
Figure 5B:
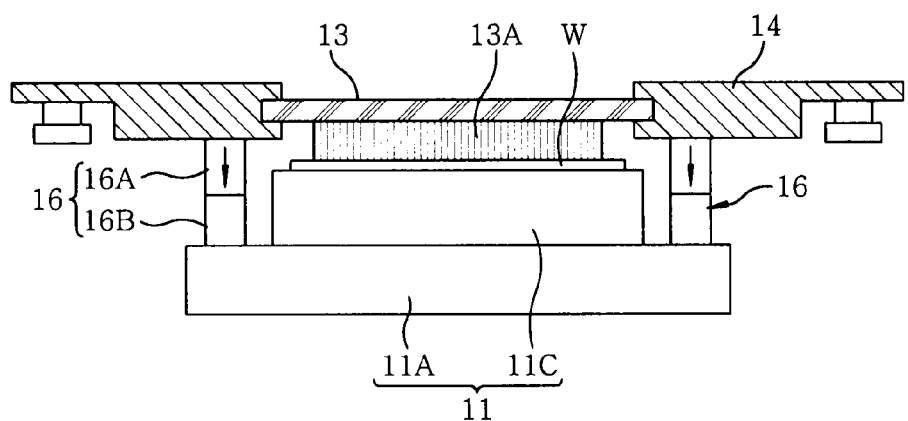
Figure 5C:
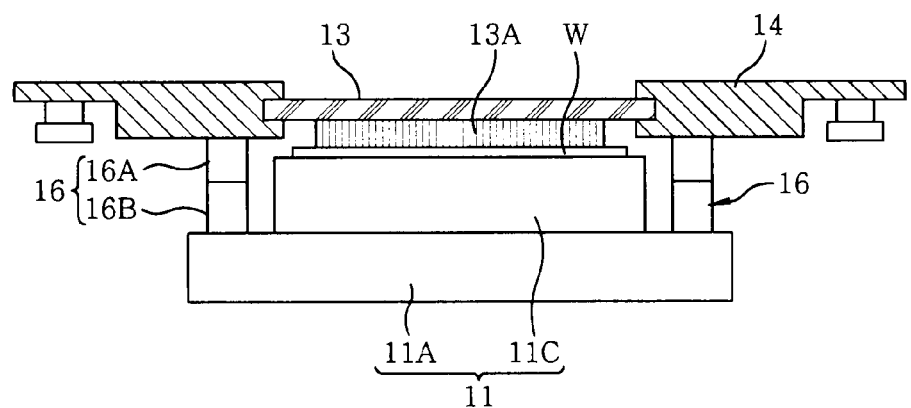
Figure 6A:
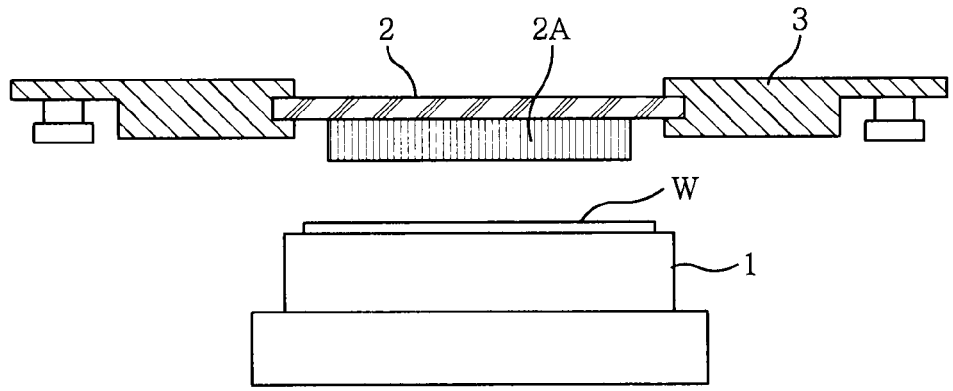
FIGS. 6A to 6C are process views, respectively, corresponding to FIGS. 3A to 3C, illustrating a conventional probe apparatus.
Figure 6B:
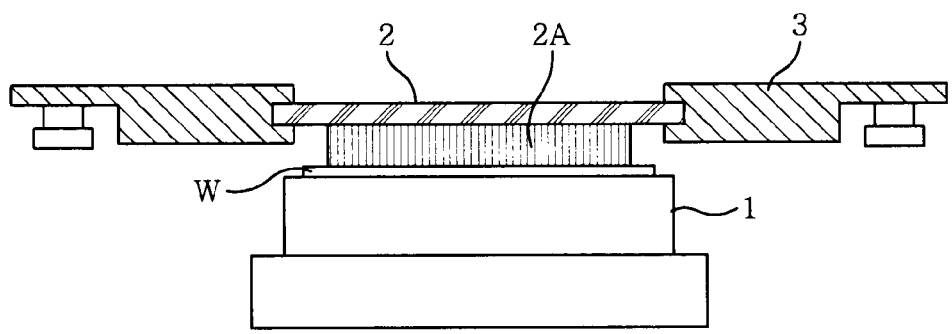
Figure 6C:
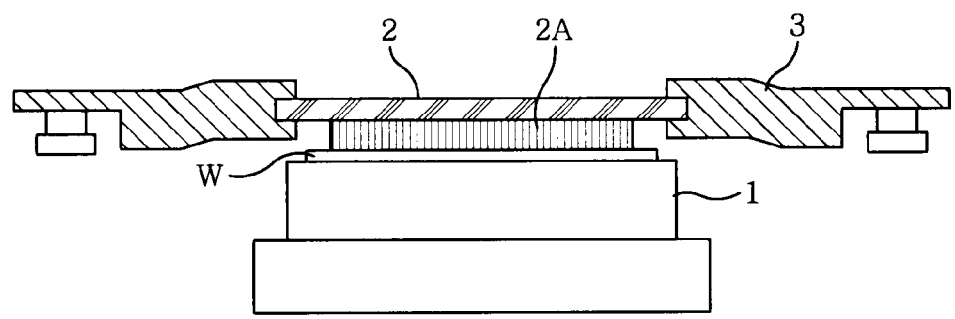
Figure 7:
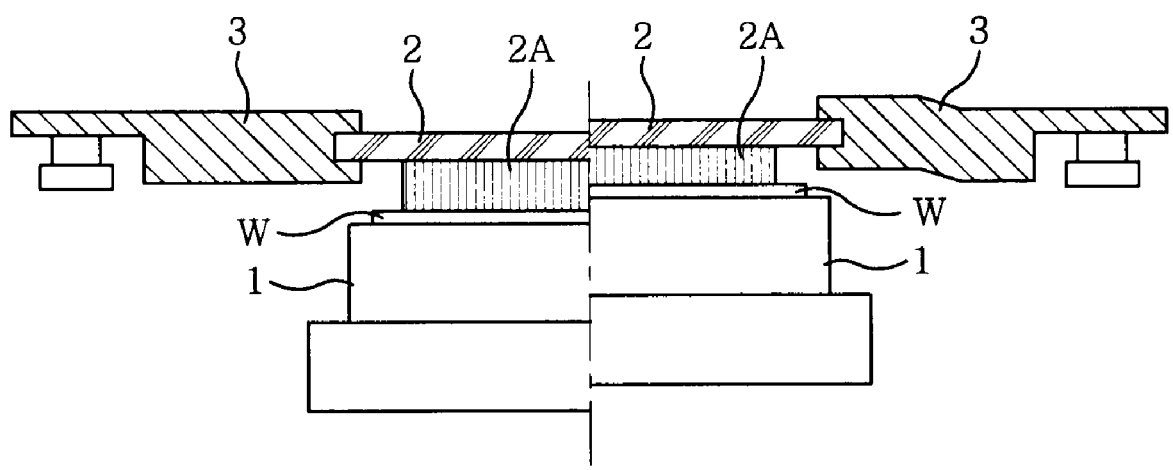
FIG. 7 is a view corresponding to FIG. 4, illustrating the conventional probe apparatus shown in FIG. 6.

A probe apparatus 10A in accordance with the second embodiment, for example, as shown in FIGS. 5A to 5C, is approximately identical to that of the first embodiment except for the mounting table 11. Accordingly, in the following description, the constituent elements of the second embodiment that are equal to or corresponding to those of the first embodiment are respectively designated by the same reference numerals, and they are described based on the configuration of the second embodiment. FIGS. 5A to 5C correspond to FIGS. 3A to 3C, respectively.

More specifically, as shown in FIGS. 5A to 5C, the mounting table 11 of the second embodiment has an integral configuration and is movable in directions of X, Y, Z and ⊖ by the drive mechanism. The mount 11C on which the semiconductor wafer W is mounted is provided at an upper surface of the mounting table 11, and the cylinder mechanisms 16 are provided at radially outer positions, i.e., on an outer peripheral region of the upper surface of the mounting table 11. Similar to the first embodiment, each of the cylinder mechanisms 16 includes the cylinder 16B and the rod 16A to be extracted from or retracted into the cylinder 16B.

In the second embodiment, the head-plate 14 is provided with the connecting mechanism (not shown) similar to that of the first embodiment. At a time when the mounting table 11 is moved upward and the electrode pads of the semiconductor wafer W comes into contact with the probes 13A without being overdriven, the rods 16A of the cylinder mechanisms 16 are extracted to be connected to the head-plate 14 via the connecting mechanism.

In the second embodiment, when the electrode pads of the semiconductor wafer W comes into contact with the probes 13A and the mounting table 11 is then overdriven, the mounting table 11 is moved upward and the rods 16A of the cylinder mechanisms 16 are retracted to pull the head-plate 14 toward the mounting table 11. When the mounting table 11 is moved upward by a preset overdrive amount, the cylinder mechanisms 16 pull the head-plate 14 toward the mounting table 11, and a predetermined load is exerted between the electrode pads of the semiconductor wafer W and the probes 13A. That is, since the cylinder mechanisms 16 pull the head-plate 14 downward, the head-plate 14 is not deformed upward and the probe card 13 is not displaced upward away from the mounting table 11 when the mounting table 11 is moved upward by the preset overdrive amount.

Next, an operation of the probe apparatus 10A according to the second embodiment will be described with reference to FIGS. 5A to 5C. As shown in FIG. 5A, if the mounting table 11 is moved to reach immediately below the probe card 13 after the semiconductor wafer W is aligned with the probes 13A, the mounting table 11 is moved upward by a predetermined distance, thus allowing the semiconductor wafer W to come into contact with the probes 13A at once as shown in FIG. 5B. At this time, the mounting table 11 is not over driven As shown in FIG. 5B, in the state where the electrode pads of the semiconductor wafer W comes into contact with the probes 13A without being overdriven, the rods 16A of the cylinder mechanisms 16 are extracted to be connected to the head-plate 14 by the connecting mechanism provided in the head-plate 14.

Subsequently, when the mounting table 11 begins to be moved upward by a preset overdrive amount, the cylinder mechanisms 16 are driven synchronously with the overdriving of the mounting table 11 and the rods 16A are retracted to pull the head-plate 14 toward the mounting table 11, thereby preventing the head-plate 14 from being deformed upward by the overdriving of the mounting table 11. At a time when the mounting table 11 is overdriven by the preset overdrive amount, a load corresponding to an originally required overdrive amount is exerted between the electrode pads of the semiconductor wafer W and the probes 13A due to a pulling force for the head-plate 14 applied by the cylinder mechanisms 16. In this way, the semiconductor wafer W comes into electrical contact with the probes 13A, enabling a desired electric characteristic test.

When the mounting table 11 begins to be moved downward after completion of the test, the rods 16A of the cylinder mechanisms 16 are gradually extracted. As soon as the mounting table 11 reaches a position at which the overdrive amount is zero, the connecting mechanism disconnects the cylinder mechanisms 16 from the head-plate 14. Accordingly, the mounting table 11 can be smoothly returned to its original reference position. Thereafter, the mounting table 11 is moved to replace the tested semiconductor wafer W by a next semiconductor wafer W, and the next semiconductor wafer W is tested in the above-described sequence.

As described above, according to the second embodiment, the cylinder mechanisms 16 are provided on the upper surface of the mounting table 11 to surround the mount 11C on which the semiconductor wafer W is mounted, and the connecting mechanism is provided in the head-plate 14 to connect the head-plate 14 and the cylinder mechanisms 16 to each other. When the semiconductor wafer W comes into contact with the probes 13A, the control unit 15 operates the cylinder mechanisms 16 and the connecting mechanism to connect the head-plate 14 and the cylinder mechanisms 16 to each other. Thereafter, the control unit 15 further operates the cylinder mechanisms 16 to pull the head-plate 14 toward the mounting table 11 to achieve electrical contact between the electrode pads of the semiconductor wafer W and the probes 13A with a predetermined load. This prevents the probe card 13 from being displaced upward due to upward deformation of the head-plate 14 and reliably assures an originally required overdrive amount of the semiconductor wafer W. As a result, a predetermined load is exerted between the electrode pads of the semiconductor wafer W and the probes 13A, resulting in reliable electrical connection therebetween and consequently, enabling highly reliable test.

The present invention is not limited to the above-described embodiments and the respective constituent elements may be appropriately modified as necessary. For example, although the above-described embodiments show an example in which the recess portions 14A are formed in the head-plate and the connecting mechanism 17 is provided in the recess portions 14A, the head-plate 14 may be provided with cylindrical protrusions and the rods of the cylinder mechanisms may be fitted into the respective cylindrical protrusions. In addition, the cylinder mechanisms may employ air cylinders, hydraulic cylinders, and the like as necessary. Of course, the object to be tested is not limited to the semiconductor wafer.

The present invention is appropriately applicable to a probe apparatus.

While the invention has been shown and described with respect to the embodiments, it will be understood by those skilled in the art that various changes and modification may be made without departing from the scope of the invention as defined in the following claims.

What is claimed is:

1. A probe apparatus comprising a movable mounting table on which an object to be tested is mounted, a probe card arranged above the mounting table and having a plurality of probes to be brought into contact with electrodes of the object, a supporting member to horizontally support the probe card, and a control unit for controlling various components including the mounting table, the probe apparatus being adapted to implement electric characteristic test of the object by overdriving the mounting table by a predetermined distance to allow the object to be brought into contact with the probes with a predetermined load, wherein the mounting table includes a mounting table main body and a chuck top provided on the mounting table main body, the chuck top being separable from the mounting table main body, wherein the chuck top is provided with a mount on which the object is mounted and a plurality of cylinder mechanisms surrounding the mount, and the supporting member is provided with a connecting mechanism to releasably connect the supporting member and the cylinder mechanisms to each other, and wherein the control unit operates the cylinder mechanisms and the connecting mechanism to connect the supporting member and the cylinder mechanisms to each other when the object comes into contact with the probes and thereafter, further operates the cylinder mechanisms to move the chuck top upward from the mounting table main body by the predetermined distance so as to achieve electrical contact between the electrodes of the object and the probes with the predetermined load.

2. The probe apparatus of claim 1, wherein the mounting table main body and the chuck top include an anti-misalignment structure to prevent the mounting table main body and the chuck top from being misaligned with each other.

3. The probe apparatus of claim 1, wherein the connecting mechanism includes chucks to clamp the respective cylinder mechanisms.

4. The probe apparatus of claim 2, wherein the connecting mechanism includes chucks to clamp the respective cylinder mechanisms.

5. A probe apparatus comprising a movable mounting table having a mount on which an object to be tested is mounted, a probe card arranged above the mounting table and having a plurality of probes to be brought into contact with electrodes of the object, a supporting member to horizontally support the probe card, and a control unit for controlling various components including the mounting table, the probe apparatus being adapted to implement electric characteristic test of the object by overdriving the mounting table by a predetermined distance to allow the object to be brought into contact with the probes with a predetermined load, wherein a plurality of cylinder mechanisms surrounding the mount is provided on an upper surface of the mounting table, and the supporting member is provided with a connecting mechanism to releasably connect the supporting member and the cylinder mechanisms to each other, and wherein the control unit operates the cylinder mechanisms and the connecting mechanism to connect the supporting member and the cylinder mechanisms to each other when the object comes into contact with the probes and thereafter, further operates the cylinder mechanisms to pull the supporting member toward the mounting table so as to achieve electrical contact between the electrodes of the object and the probes with the predetermined load.

6. The probe apparatus of claim 5, wherein the connecting mechanism includes chucks to clamp the respective cylinder mechanisms.

* * * * *